United States Patent [19]

Hegeler et al.

[11] Patent Number: 5,278,560

[45] Date of Patent: Jan. 11, 1994

[54] BINARY SIGNAL GENERATOR FOR RDS RADIO RECEIVER

[75] Inventors: Wilhelm Hegeler, Hildesheim; Jürgen Kässer, Diekholzen, both of Fed. Rep. of Germany

[73] Assignee: Blaupunkt Werke GmbH, Hildesheim, Fed. Rep. of Germany

[21] Appl. No.: 818,058

[22] Filed: Jan. 8, 1992

[30] Foreign Application Priority Data

Jan. 29, 1991 [DE] Fed. Rep. of Germany ....... 4102519

[51] Int. Cl.$^5$ ............................................. H03M 1/44
[52] U.S. Cl. ..................................... 341/155; 341/164
[58] Field of Search ............... 341/155, 157, 161, 162, 341/163, 164, 165, 166, 143

[56] References Cited

U.S. PATENT DOCUMENTS

| | | | |
|---|---|---|---|
| 3,827,046 | 7/1974 | Watson | 341/157 |
| 3,895,377 | 7/1975 | Schwalenstocker | 341/157 |
| 4,929,851 | 5/1990 | Pace | 307/359 |

OTHER PUBLICATIONS

O. Roth, et al., "Self-Adjustable Waveform Squaring Circuit," IBM Technical Disclosure Bulletin, vol. 16, No. 1, Jun. 1973, Armonk, N.Y.

Patent Abstracts of Japan, vol. 6, No. 37, Item (E-97)(915), Mar. 6, 1982, abstracting Japanese publication 56-157124 (A), Dec. 4, 1981, Tanabe/Toshiba, "Waveform Shaping Circuit".

*Primary Examiner*—Howard L. Williams
*Attorney, Agent, or Firm*—Frishauf, Holtz, Goodman & Woodward

[57] ABSTRACT

In a circuit arrangement for deriving a binary signal from an alternating voltage (U), in which the alternating voltage can be delivered via a capacitor to the input of a threshold value circuit and a reference voltage obtained by integration serves to adjust the operating point at the input, an up/down counter is provided for deriving the reference voltage, its counting direction being controllable by the binary signal. From the output signal of the up/down counter, a further binary signal is derived, which after integration forms the reference voltage. The circuit is suitable for use in evaluating the data subcarrier component of a Radio Data System (RDS) signal, as defined by European Broadcasting Union (EBU) Technical Standard 3244-E.

11 Claims, 2 Drawing Sheets

BINARY SIGNAL GENERATOR FOR RDS RADIO RECEIVER

CROSS-REFERENCE TO RELATED LITERATURE

European Broadcasting Union Technical Standard 244-E, entitled SPECIFICATIONS OF THE RADIO DATA SYSTEM RDS FOR VHF/FM SOUND BROADCASTING (EBU Technical Center, Brussels, Mar. '84, 60 pp.);

CROSS-REFERENCE TO RELATED PATENTS AND APPLICATIONS, ASSIGNED TO BLAUPUNKT WERKE GMBH OR ITS PARENT ROBERT BOSCH GMBH, THE DISCLOSURES OF WHICH ARE HEREBY INCORPORATED BY REFERENCE

U.S. Pat. No. 3,949,401, HEGELER et. al., issued Apr. 6, 1976;

U.S. Pat. No. 4,435,843, EILERS & BRAGAS, issued Mar. 1984;

U.S. Pat. No. 4,450,589, EILERS & BRAGAS, issued May 1984;

U.S. Pat. No. 4,499,603, EILERS, issued Feb. 1985;

U.S. Pat. No. 4,862,513, GRAGAS, issued Aug. 29, 1989, entitled RADIO RECEIVER WITH TWO DIFFERENT TRAFFIC INFORMATION DECODERS U.S. Pat. No. 5,060,300, LUBER et. al., issued Oct. 22, 1991, German Patent Disclosure DE-OS 39 04 344, TEMPELHOF, Feb. 14, 1989, to which U.S. Ser. No. 468,703, filed Jan. 23, 1990, corresponds (attorney docket no. 890753-MO; IF PAID Aug. 28, 1991); and corresponding U.S. Pat. Nos. 5,101,357, issued Mar. 31, 1992;

U.S. Ser. No. 775,939, DUCKECK & BRAGAS, filed Oct. 28, 1991, based on German pending application P 39 14 104.7+PCT/DE90/00250

U.S. Pat. No. 4,888,699, KNOLL et. al., issued Dec. 19, 1989 and its C-I-P, U.S. Ser. No. 452,677, KNOLL et. al., filed Dec. 18, 1989;

U.S. Ser. No. 07/810,866, KNOLL et. al., filed Dec. 20, 1991;

U.S. Ser. No. 07/671,261, ATTIG et. al., filed Mar. 18, 1991;

U.S. Ser. No. 07/678,654, ATTIG, KASSER, DUCKECK & EILERS;

U.S. Ser. No. 07/744,296, KASSER, filed Aug. 13, 1991.

FIELD OF THE INVENTION

The present invention relates generally to a circuit arrangement for deriving a binary signal from an alternating voltage that can be supplied via a capacitor to the input of a threshold value circuit; a reference voltage obtained by integration serves to set the operating point at the input.

For purposes of digital signal processing, circuit arrangements that generate a binary signal, in other words a signal having two possible voltage values, from a supplied alternating voltage, are often needed; the edges of this signal are located substantially at the zero crossovers of the alternating voltage. The duty cycle for a sinusoidal alternating voltage is then approximately 50%.

In known circuits, the alternating voltage is delivered for this purpose to the input of an amplifier, formed as a threshold value circuit, via a capacitor. In such circuit arrangements, having an inverter provided, per se for digital circuits, the inverter output signal is fed back via a circuit for mean value formation—preferably an RC element with a suitable time constant—to the input of the inverter in order to regulate the threshold value with respect to the amplitude range of the alternating voltage; this results in a corresponding regulation of the operating point at the input of the inverter. In a particularly simple known circuit, the coupling capacitor provided for the alternating voltage is simultaneously used as a capacitor to form the mean value. This known circuit arrangement has the disadvantage, however, that if the input switching threshold deviates from the mean value, the result is an output signal that on average is asymmetrical: the output signal duty cycle ranges from 0% to 100% if this switching threshold varies from 0 up to the supply voltage.

Another disadvantage is that if the RC element time constant is not high enough, a delta voltage having the frequency of the input or output voltage is coupled to the input, causing the circuit to oscillate at its natural frequency if the input signals are too low, while if the input signals are somewhat higher, strong phase shifts can occur. However, for the sake of control speed and because of the expense, it is often not possible to lengthen the time constant arbitrarily.

THE INVENTION

An object of the invention is to provide a circuit arrangement for deriving a binary signal from an alternating voltage that largely overcomes these disadvantages. In particular, the circuit arrangement according to the invention is intended to continue to function even if the alternating voltage amplitudes fluctuate sharply, as happens for instance with an auxiliary carrier for a radio data signal (RDS), as described in the EBU Specification mentioned above.

Briefly, the invention provides an up/down counter, the counting direction of which is controllable by the binary signal, for the derivation of the reference voltage; from the counter output signal, a further binary signal is derived that after integration forms the reference voltage. The circuit arrangement of the invention has the advantage that a perfect derivation of a binary signal is possible even if the alternating voltage amplitudes are low or fluctuating. The additional expense compared with known circuits is solely in the digital area, where it is virtually insignificant, given the present of the art of integrated circuits.

DRAWINGS

FIG. 1 is a block circuit diagram of a first exemplary embodiment of the invention;

FIGS. 2(a)-(d) are timing diagrams for the signals that occurs in circuit arrangement of FIG. 1;

Figure 1:
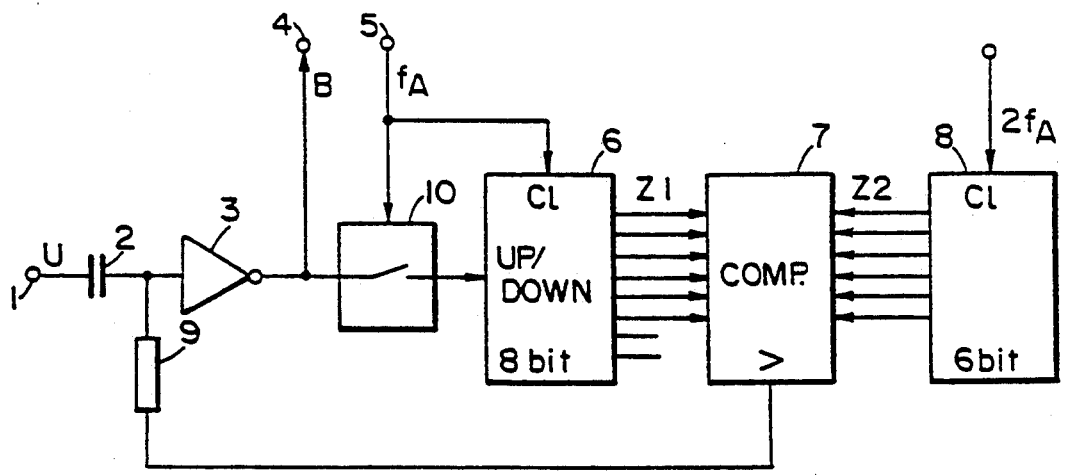

DETAILED DESCRIPTION OF THE PREFERRED EMBODIMENTS:

Identical elements are identified by the same reference numerals in the drawings. In addition, the signals shown in FIGS. 2(a)-2(d) are designated by the same reference numerals as the corresponding points of the circuit of FIG. 1.

In the circuit arrangement of FIG. 1, the alternating voltage is delivered via an input 1 and a coupling capacitor 2 to the input of an inverter 3. The output of the inverter, on the one hand, represents the output 4 of the circuit arrangement and, on the other, is connected to a sampler stage 10, which is controlled with a sampling frequency $f_A$, which is applied to a further input 5. The thus-clocked binary signal controls the counting direction of an up/down counter 6, which is likewise clocked with $f_A$.

The up/down counter 6 has a capacity of eight bits, although of these only the six most significant bits are evaluated as a signal Z1. To this end, the corresponding outputs are connected to inputs of a comparator 7, the further inputs of which are connected to outputs of a further counter 8, which is clocked with twice the sampling frequency $f_A$, which keeps these clock signals in phase. The further counter 8 is a six-bit counter, which is operated such that its counter state passes through a middle range of values, for example from 13 through 50. This is a "middle" range with respect to the value range of up/down counter 6. To this end, in a manner known per se, suitable feedbacks via logic circuits, not shown, are provided that set the counter to 13 once the counter state has attained the value of 50.

The comparator 7 outputs a signal with the logic level H (e.g. HIGH), if the counter state of the up/down counter 6 is greater than the counter state of the further counter 8. This signal is fed via a resistor 9 to the input of the inverter 3. Together with the coupling capacitor 2, the resistor 9 forms an integrator, or a circuit for forming the mean value, on the condition that the internal resistance of the alternating voltage source, connected to the input 1, is small compared with that of the resistor 9.

OPERATION

Figure 2A:
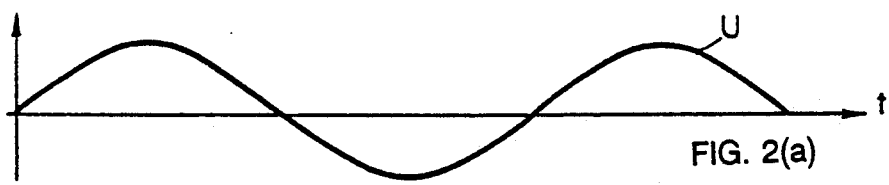
Figure 2B:
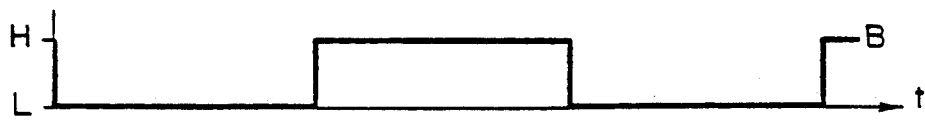

The mode of operation of the circuit arrangement of FIG. 1 will now be described in further detail in conjunction with the diagrams of FIGS. 2(a)-2(d). The alternating voltage U of FIG. 2(a) is an auxiliary carrier, for a radio data signal, having a frequency of 57 kHz for example. With the aid of the circuit arrangement of FIG. 1, a binary signal B shown in FIG. 2(b) is derived from it, the edges of which substantially match the zero crossovers of the alternating voltage U.

The up/down counter 6 counts upward if the signal B assumes level H, while level L (e.g. LOW) of the signal B effects a downward counting of the up/down counter 6. The counter state Z1 of the up/down counter 6 thus follows the binary signal B in the form of a triangular function; at a duty ratio of 50%, the upward and downward counting processes stay in balance. If the duration of the H level predominates in the binary signal B, however, then Z1 becomes gradually greater, while Z1 becomes smaller if the duration of the L level predominates. The up/down counter 6 is provided with an overflow block, which has the effect that once the maximum and counter states are reached, these states are adhered to if upward or downward counting continues.

When an auxiliary carrier of a radio data signal is evaluated, the frequency of the signals U and B is 57 kHz, while the up/down counter 6 is preferably clocked with a frequency of 4.332 MHz. Within one half-wave of the signals U or B, the up/down counter 6 correspondingly counts upward or downward by 38. Because the two least significant bits of the counter 6 are ignored, a fluctuation in the signal Z1 by 38/4 is the result, at a duty cycle of 50%. If the duty cycle varies, then the upward or downward counting will predominate, and so the counter state will vary accordingly.

Figure 2C:
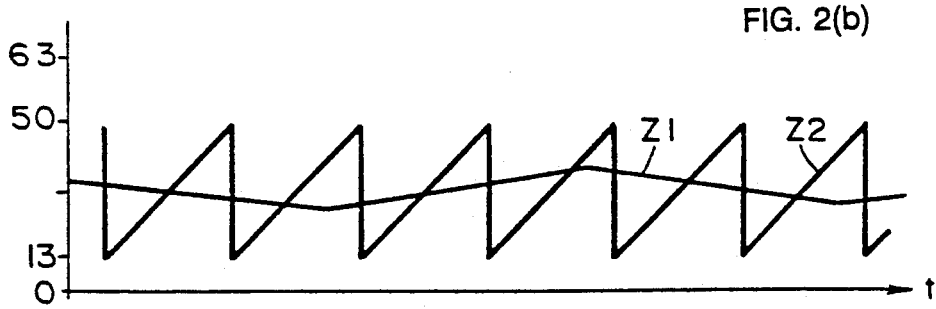
Figure 2D:
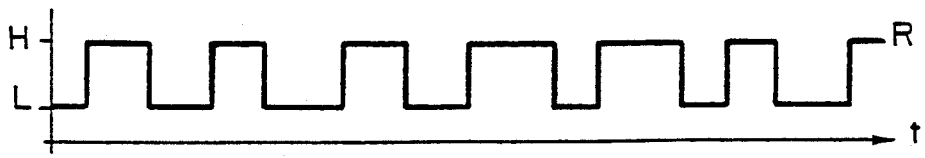

As shown in FIGS. 2(c) and 2(d), by comparing the signal Z1 with the signal Z2, which passes through the range of values between 13 and 50, the binary signal R shown in FIG. 2(d) is obtained. This signal assumes the H level if the signal Z1 is greater than the signal Z2. Otherwise, signal R remains at L.

By means of the RC element 9, 2, the mean value is formed from the signal R and supplied to the input of the inverter 3. The mean value of the signal R becomes greater, the longer the period of time during which the signal Z1 is greater than the signal Z2. By shifting the input signal of the inverter 3 in the positive direction, however, the duty cycle of the binary signal B becomes shorter; that is, this signal remains longer at the L level than at the H level. As a result, the mean counter state of the up/down counter 6 becomes lower, which, via a reduction in the mean value of binary signal R, counteracts the decrease in the duty cycle of binary signal B.

Figure 3:
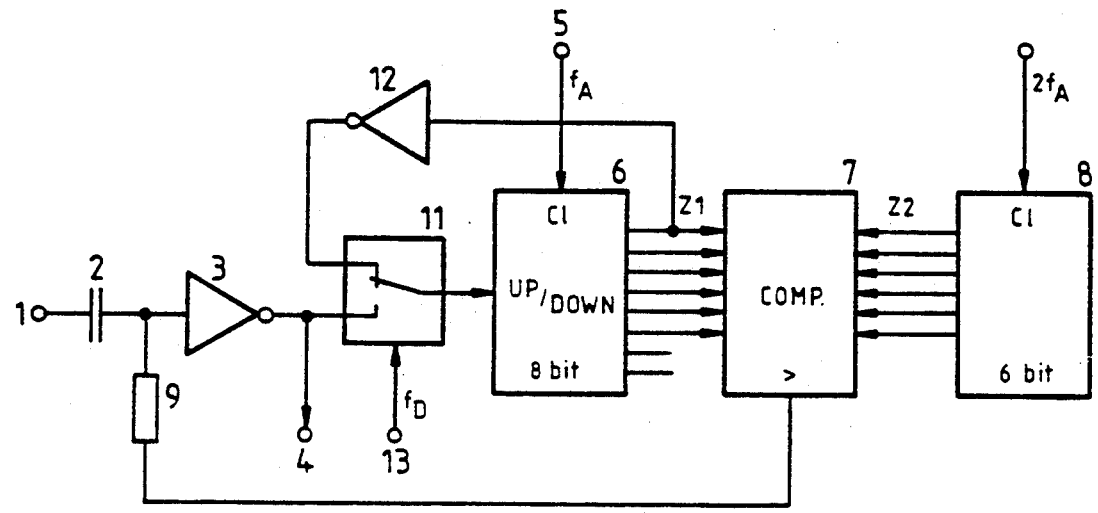
FIGS. 3 shows a second exemplary embodiment.

The exemplary embodiment of FIG. 3, in its essential components, is similar to that of FIG. 1. However, to damp any possible control oscillations, the up/down counter 6, which operates as an integrator, is damped in the exemplary embodiment of FIG. 3 by the provision that it is moved by one counting increment toward the middle of its range of values at regular time intervals. To this end, a multiplexer 11 is provided, which is moved into the upper position briefly, for example for one clock period at a time, with a clock signal of the frequency fD. During this time, the most significant bit of the signal Z1, fed through a further inverter 12, is fed to the up/down input of the up/down counter 6. Since, in binary encoding, the most significant bit in the lower half of the range of values is zero and in the upper half is one, the counter state is incremented whenever the counter is in the lower half and is decremented in the upper half. As a result, there is a tendency toward the middle of the range of values, which damps the control circuit.

Two further improvements of the circuit arrangement according to the invention will now be explained in conjunction with the exemplary embodiment of FIG. 4. Otherwise, the circuit arrangement of FIG. 4 is like that of FIG. 3.

Figure 4:
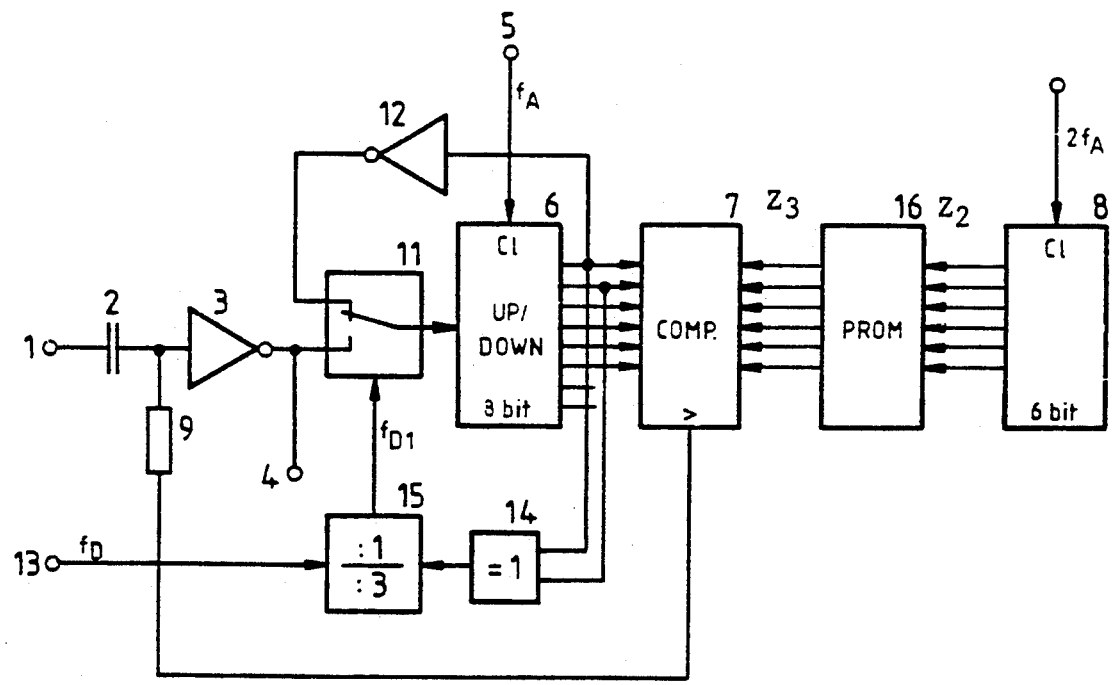
FIG. 4 shows a third exemplary embodiment.

In the exemplary embodiment of FIG. 4, first, a more-uniform damping over the range of values is possible because the frequency with which the up/down counter 6 is controlled in the direction of the middle of the range of values is dependent on the counter state. To this end, the two most significant bits of Z1 are supplied via an EXCLUSIVE OR circuit 14 to a controllable frequency divider 15, which either does not vary the frequency $f_D$ of the clock signal, present at 13, or divides it by three. As a result, the frequency $f_{D1}$, with which the multiplexer 11 is operated, is controlled in such a way that on the peripheries of the range of values, it is higher than in the middle; this is shown in the following table.

| MSB | XOR | fD1 | sign |
|---|---|---|---|
| 1 1 | 0 | 228 kHz | − |
| 1 0 | 1 | 228/3 kHz | − |
| 0 1 | 1 | 228/3 kHz | + |
| 0 0 | 0 | 228 kHz | + |

In the table, MSB stands for the two most significant bits, XOR is the output signal of the EXCLUSIVE OR circuit 14, $f_{D1}$ is the frequency at which the multiplexer 11 is operated, and sign indicates the direction in which the up/down counter 6 is controlled with the frequency $f_{D1}$. The result is three equally high stages of ($\frac{2}{3}$) 228 kHz each, by means of which control oscillations are damped as long as the counter state, as a result of the behavior of the input signal, passes through or touches one of these limits or the limits of the entire range of values. Within the scope of the invention, a finer subdivision is also conceivable, in which further bits can also be evaluated, in addition to the two most significant bits in the exemplary embodiment of FIG. 4.

As can be seen from FIGS. 2(c)-2(d), the signal Z1, and thus the signal R, include a component having the frequency of the input signal U. Since, for the sake of control speed, the RC element 9, 2 cannot be provided with an arbitrarily long time constant, such a component persists even in the signal coupled back to the input of the inverter 3. This can also cause a tendency to oscillation.

To attenuate this component, the exemplary embodiment of FIG. 4 provides that the comparison signal Z2 contains the value of the middle part of the range of values, but out of order. To this end, a programmable read only memory (PROM) 16 is provided, which assigns a different value to each of the values of the counter 8. The signal Z3, which is supplied by PROM 16, to comparator 7 in the exemplary embodiment of FIG. 4, then contains the same numerical values as the signal Z2, but in a different order. Thus, the signal Z3 does not have the sawtooth shape of the signal Z2 shown in FIG. 2(c), but instead assumes all the values of the middle part of the range of values in a quasi-random order. As a result, the output signal of the comparator is divided into many shorter pulses, which distributed virtually at random occupy the entire range of one period each. Nothing in the mean value of the signal R changes, however.

Various changes and modifications may be made, and features described in connection with any one of the embodiments may be used with any of the others, within the scope of the inventive concept.

We claim:

1. A circuit for deriving a binary output signal (b) from an alternating voltage (U), comprising
    an input terminal (1) for receiving said alternating voltage signal (U),
    a capacitor (2) connected to said input terminal (1) and to an input (3) of a threshold value circuit (6-8; 16);
    means (10) for adjusting a switching threshold of said threshold value circuit, using a reference voltage feedback value obtained by integration (2,9);
    an input terminal (5) for receiving a binary clock signal ($f_A$);
    an up/down counter (6), the counting direction of which is controllable by the binary output signal (B), and forming a part of said threshold value circuit;
    said up/down counter (6) receiving said binary clock signal and generating a first output signal (Z1);
    a further counter (8) generating a comparison signal (Z2); and
    means (7) for processing said first output signal and said comparison signal to derive a further binary signal which, after integration, forms the reference voltage feedback value.

2. The circuit of claim 1, wherein
    the further binary signal is derived by means of a comparison (7) of the output signal of the up/down counter (6) with said comparison signal (Z2).

3. The circuit of claim 2, wherein
    the comparison signal (Z2) is a digital signal, which periodically passes through a middle portion of the range of values of the output signal (Z1), to be compared, of the up/down counter (6).

4. The circuit of claim 3, wherein
    the comparison signal contains the values of the middle part of the range of values, arranged out of numerical sequence.

5. The circuit of claim 4, wherein
    the up/down counter (6) is, at predetermined time intervals, briefly controlled (11) to count toward the middle of the range of values.

6. The circuit of claim 2, wherein
    the up/down counter (6) is, at predetermined time intervals, briefly controlled (11) to count toward the middle of the range of values.

7. The circuit of claim 3, wherein
    the up/down counter (6) is, at predetermined time intervals, briefly controlled (11) to count toward the middle of the range of values.

8. The circuit of claim 1, wherein
    respective clock signals ($f_A$), delivered to the up/down counter (6) and to the further counter (8), are coupled in phase and have respective frequencies, one of which is an integer multiple of the other.

9. The circuit of claim 1, wherein
    the up/down counter (6) is, at predetermined time intervals, briefly controlled (11) to count toward the middle of the range of values.

10. The circuit of claim 9, wherein
    the predetermined interval, at which the up/down counter (6) is controlled to count toward the middle of the range of values, is a function of the output signal of the up/down counter (6).

11. The circuit of claim 10, wherein
    said predetermined interval is a function of the two most significant bits of he output signal of the up/down counter (6).

* * * * *